(12) United States Patent
Shakiba et al.

(10) Patent No.: US 8,351,493 B2
(45) Date of Patent: Jan. 8, 2013

(54) FOLDING SEQUENTIAL ADAPTIVE EQUALIZER

(75) Inventors: Hossein Shakiba, Richmond Hill (CA); Mansour Shashaani, Burlington (CA)

(73) Assignee: Gennum Corporation, Burlington (CA)

( * ) Notice: Subject to any disclaimer, the term of this patent is extended or adjusted under 35 U.S.C. 154(b) by 883 days.

(21) Appl. No.: 12/272,851

(22) Filed: Nov. 18, 2008

(65) Prior Publication Data

US 2010/0124265 A1    May 20, 2010

(51) Int. Cl.
    *H03H 7/30*    (2006.01)
(52) U.S. Cl. ......... 375/229; 330/288; 332/124; 375/232
(58) Field of Classification Search ............. 333/18; 375/229, 232, 319; 330/260, 304
    See application file for complete search history.

(56) References Cited

U.S. PATENT DOCUMENTS

| 4,942,374 | A | * | 7/1990 | Sai ............................. 332/124 |
| 5,426,389 | A | | 6/1995 | Webster |
| 5,940,441 | A | | 8/1999 | Cranford |
| 5,978,417 | A | | 11/1999 | Baker et al. |
| 5,987,065 | A | | 11/1999 | Candage |
| 6,137,832 | A | | 10/2000 | Lin et al. |
| 6,304,615 | B1 | | 10/2001 | Webster |
| 6,463,108 | B1 | | 10/2002 | Shakiba |
| 6,492,876 | B1 | | 12/2002 | Kamal et al. |
| 6,501,792 | B2 | | 12/2002 | Webster |
| 7,065,134 | B2 | | 6/2006 | Papanikolaou et al. |
| 7,415,064 | B2 | | 8/2008 | Sivadas et al. |
| 2002/0034221 | A1 | | 3/2002 | Webster |
| 2003/0043897 | A1 | * | 3/2003 | Papanikolaou et al. ....... 375/229 |
| 2003/0053534 | A1 | | 3/2003 | Sivadas et al. |
| 2006/0121860 | A1 | | 6/2006 | Lee |
| 2006/0140262 | A1 | | 6/2006 | Kuijk |
| 2006/0182171 | A1 | | 8/2006 | Kuijk |
| 2007/0201545 | A1 | | 8/2007 | Zamir et al. |
| 2009/0091393 | A1 | * | 4/2009 | Quan et al. ..................... 330/288 |

OTHER PUBLICATIONS

International Search Report and Written Opinion issued for corresponding PCT application No. PCT/CA2009/001624 dated Feb. 17, 2010.
WP 23.3—A 2.5Gb/s Adaptive Cable Equalizer, Hossein Shakiba, 1999.
FA 10.7: An Adaptive Cable Equalizer for Serial Digital Video Rates to 400Mb/s, Alan J. Baker, 1996.

* cited by examiner

*Primary Examiner* — Leon-Viet Nguyen
(74) *Attorney, Agent, or Firm* — Ridout & Maybee LLP

(57) ABSTRACT

A folding adaptive equalizer is provided. The equalizer comprises an equalizer core and an automatic gain control loop. The equalizing transfer function of the equalizer core is modulated by one or more gain control signals generated by the automatic gain control loop and by a folding signal generated by the automatic gain control loop. When the folding signal is inactive, an increase in the gain control signals produces an increase in the high-frequency, high-bandwidth gain of the transfer function of the equalizer core. When the folding signal is active, further gain can be applied by decreasing the gain control signals, which produces a frequency-shift in the transfer function of the equalizer core toward lower bandwidth and an increase in the high-frequency, low-bandwidth gain of the transfer function of the equalizer core.

8 Claims, 18 Drawing Sheets

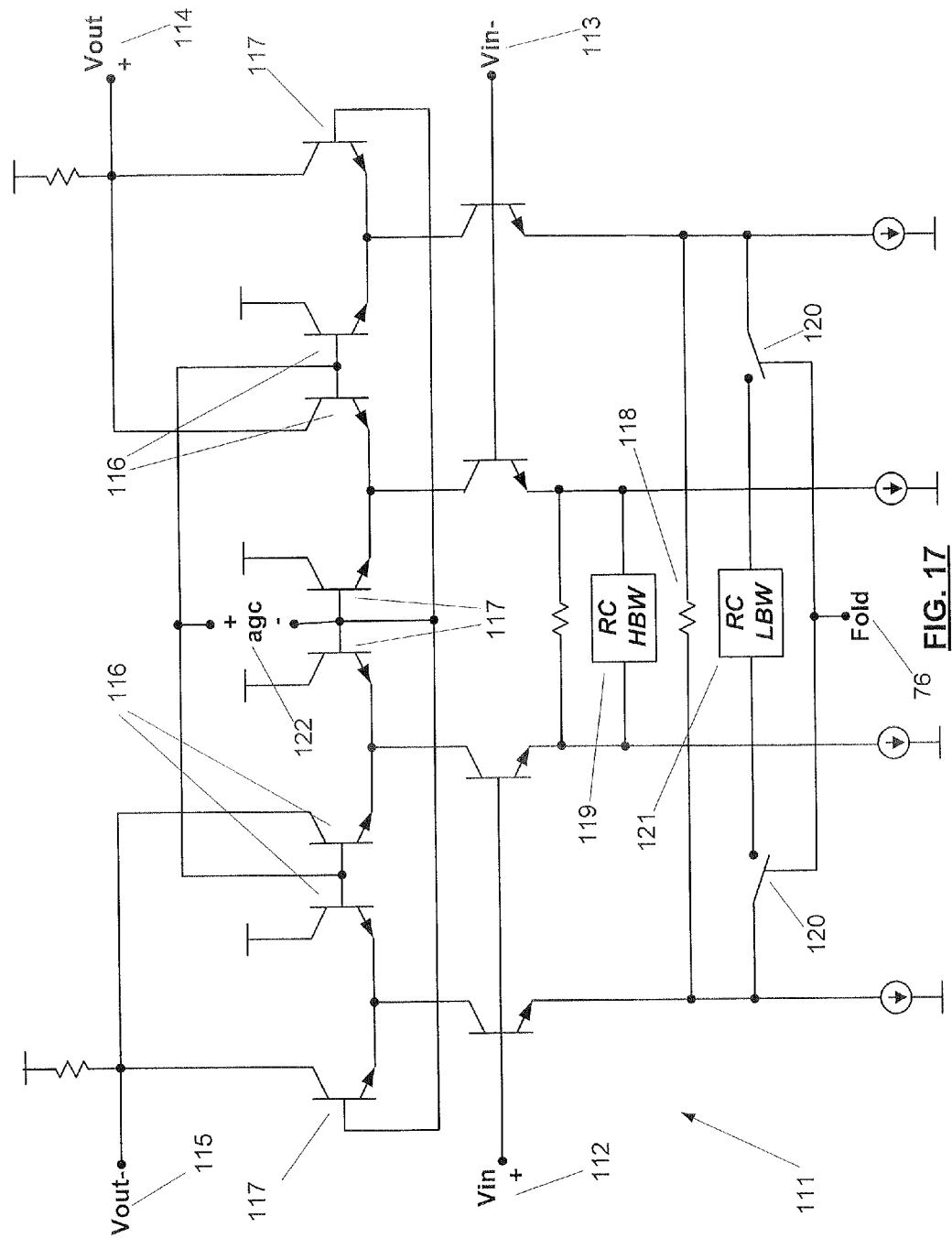

FOLDING SEQUENTIAL ADAPTIVE EQUALIZER

TECHNICAL FIELD

This disclosure relates to the field of adaptive equalizers.

BACKGROUND

Equalizers can be used to compensate for signal loss resulting from transmission through a non-ideal medium. Such equalizers generally compensate for signal loss by applying a transfer function to the received signal with gain and frequency characteristics inverse to the degradation introduced by the transmission medium.

The transfer function $1+\alpha G(s)$ is usually used to implement the inverse response of the cable or other transmission medium in adaptive equalizers designed to work with variable degrees of transmission degradation, such as those introduced by variable lengths of cable. The constant term 1 represents the absence of cable attenuation at direct current (frequency=0), and the transfer function $G(s)$ is a high frequency boosting gain. The factor $\alpha$ is the adaptation factor and varies from 0, corresponding to 0 meters of cable, to 1, corresponding to the maximum cable length for which the equalizer is designed.

Example implementations and operational descriptions of sequential single- and multi-rate adaptive equalizers are disclosed in U.S. patent application Pub. No. 2003/0043897 A1, which is owned by the Assignee of the present application, and which is hereby incorporated into the present application by reference.

BRIEF DESCRIPTION OF THE DRAWINGS

FIG. 16 is a graph illustrating examples of three different transfer functions of the gain stage of FIG. 15 or FIG. 15a;

FIG. 17 is a circuit diagram showing an example set of differential transistor pairs and RC circuits that can be used to implement the gain stage of FIG. 15a.

DETAILED DESCRIPTION OF EXAMPLE EMBODIMENTS

Example embodiments described herein include an adaptive equalizer that compensates for signal loss resulting from transmission through non-ideal media by applying a transfer function whose gain and bandwidth profile varies depending on the characteristics of the received signal, and which makes use of a folding function to use the same gain boosting circuits to boost both high-bandwidth and low-bandwidth signals. Example embodiments of the adaptive equalizer described herein may for example be suited for use with various data communication systems, including Serial Digital Interface (SDI), using different data rates and cable lengths.

Figure 1:
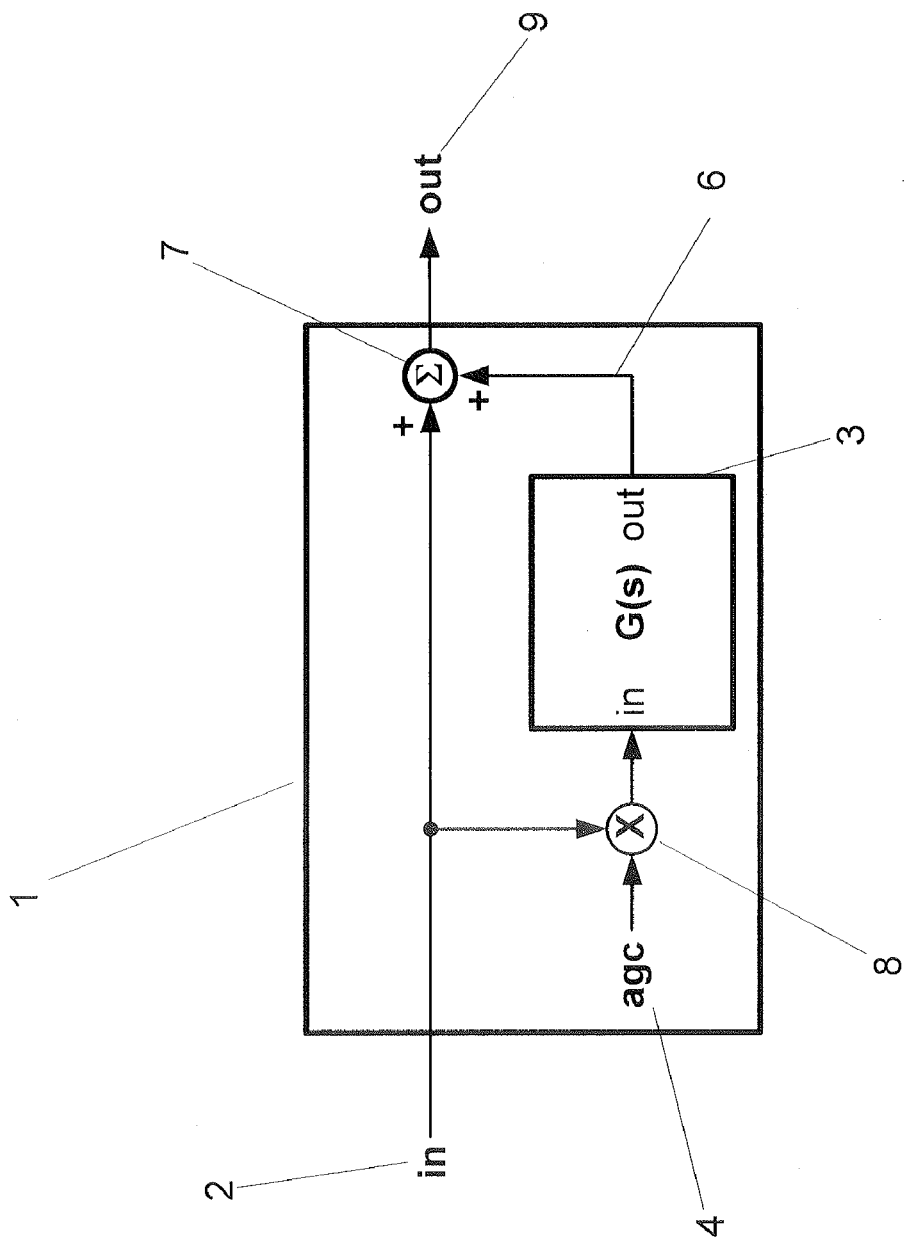
FIG. 1 is a block diagram of an equalizer in a typical data communication system in which an input signal is received through a transmission medium.

In order to provide a better understanding of example embodiments of the present invention, a general description of adaptive equalizers will be provided before going into the specific features of the present invention. FIG. 1 illustrates the use of an adaptive equalizer 1 in a typical data communication system in which an input signal 2 is received after being transmitted through a transmission medium. The incoming signal 2 is fed through a gain boosting stage 3 that implements the transfer function $G(s)$; this gain boosting stage 3 is modulated at a modulator 8 by an automatic gain control ("agc") signal 4 corresponding to the value a, and the gain applied by the boosting stage 3 is proportional to the strength of this gain control signal 4, resulting in the transfer function $\alpha G(s)$ being applied to the input signal 2 being fed into the gain boosting stage 3. The output 6 of this stage 3 is then summed at a summer 7 with the raw incoming signal 2 to generate a final output signal 9 characterized by the transfer function $1+\alpha G(s)$.

Figure 2:
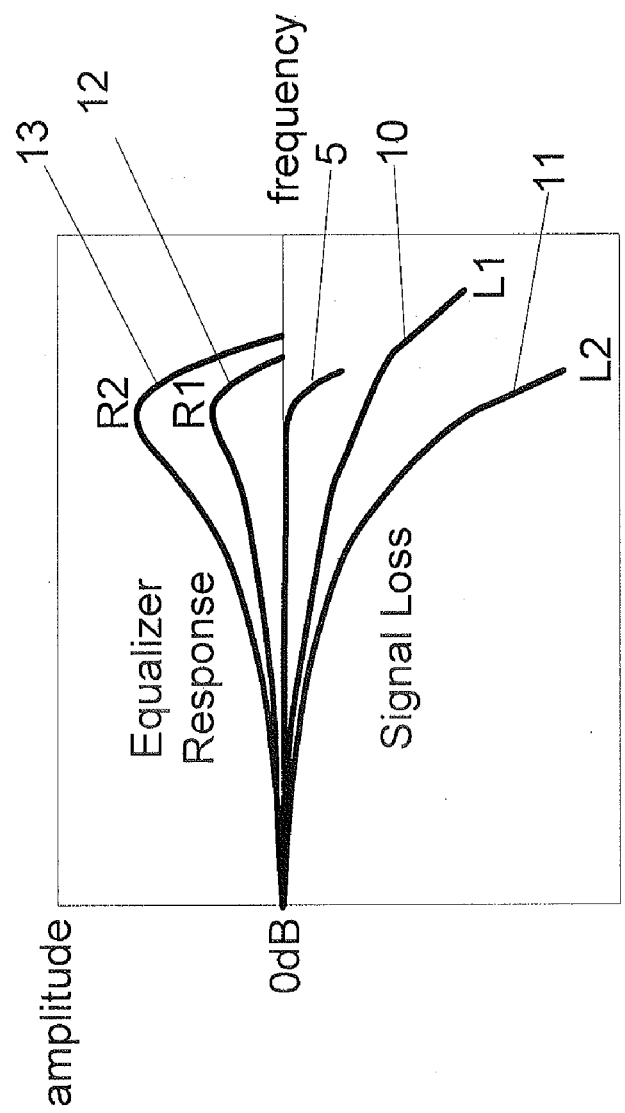
FIG. 2 is a graph showing the loss (in dB) incurred in the transmission medium, plotted as a function of the frequency (f) of the signal and shown for two different lengths (L1 and L2) of the transmission medium, along with two equalizer responses (R1 and R2) designed to equalize the signal loss resulting from the two lengths of the transmission medium.

Referring to the drawings, FIG. 2 shows the signal loss 10, 11 and equalizer response 12, 13 for two different lengths of cable, plotted as a function of signal frequency. The signal loss 10 resulting from a first, short length of cable L1 is equalized by an equalizer response R1 12 approximating the inverse of the transfer function of the cable of length L1 10, with the addition of a low-pass filter designed to limit the amount of high-frequency noise amplification resulting from the equalization. Similarly, the more significant loss transfer function 11 of the longer cable L2 is equalized by a higher-gain equalizer response R2 13 with a low-pass filter. The application of either of these transfer functions 12, 13 to the degraded signal produced by its corresponding cable length 10, 11 produces an output signal 5 that is flat, except at very high frequencies where it is attenuated to eliminate high-frequency noise.

An adaptive equalizer may also make use of several gain stages 1 introduced sequentially as the degree of signal degradation rises with the length of the cable. Each of these stages 1 applies a transfer function that equalizes the received signal 2 in proportion to a given length of cable: thus, an exemplary three-stage adaptive equalizer designed to accommodate cable lengths up to 300 meters will apply the first gain boosting stage 1 to cable lengths up to 100 meters, the first and second stages 1 to lengths between 100 and 200 meters, and all three stages 1 to cable lengths between 200 and 300 meters. The adaptation factor $\alpha$ can here be broken into three stages—$\alpha 1$, $\alpha 2$, and $\alpha 3$—which all begin at their minimum value and each rise to their maximum value in sequence. Thus, as the cable length increases, first $\alpha 1$ rises from 0 to 1; at 100 meters of cable, $\alpha 1$ is at its maximum value of 1, and $\alpha 2$ begins rising in value as the cable length continues to increase. At 200 meters of cable, $\alpha 2$ reaches its maximum value of 1, and $\alpha 3$ begins to increase. At 300 meters of cable, all three factors are at their maximum values, and the adaptation limit of the equalizer is reached.

Figure 3:
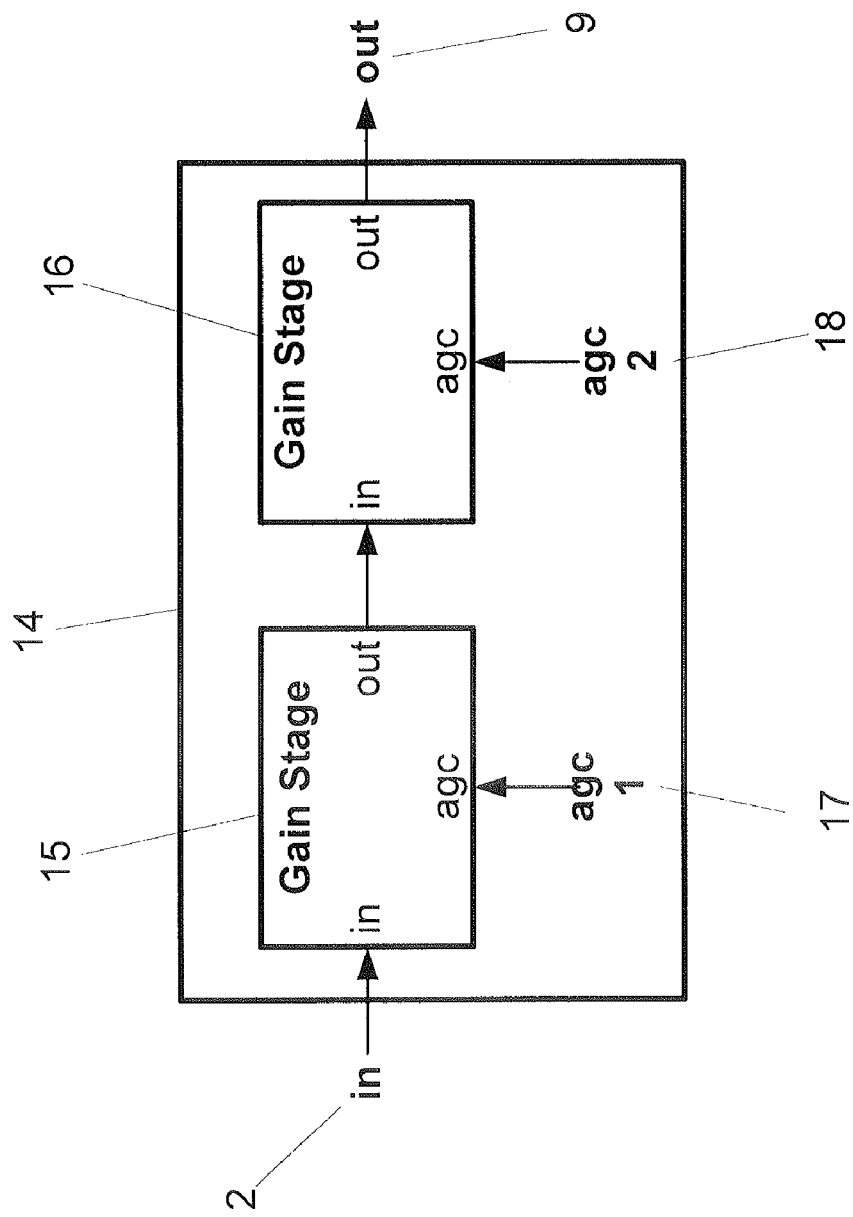
FIG. 3 is a block diagram showing a multiple-stage equalizer core.

Referring to the drawings, FIG. 3 shows the operation of a two-stage adaptive equalizer 14. The incoming signal 2 passes through two gain stages 15, 16 in sequence, each of which applies a transfer function designed to negate all or part of the signal loss resulting from the transmission medium, finally generating an equalized output signal 9. The first gain stage 15 is modulated by the automatic gain control signal agc1 17, and the second gain stage 16 is modulated by the automatic gain control signal agc2 18.

Figure 4:
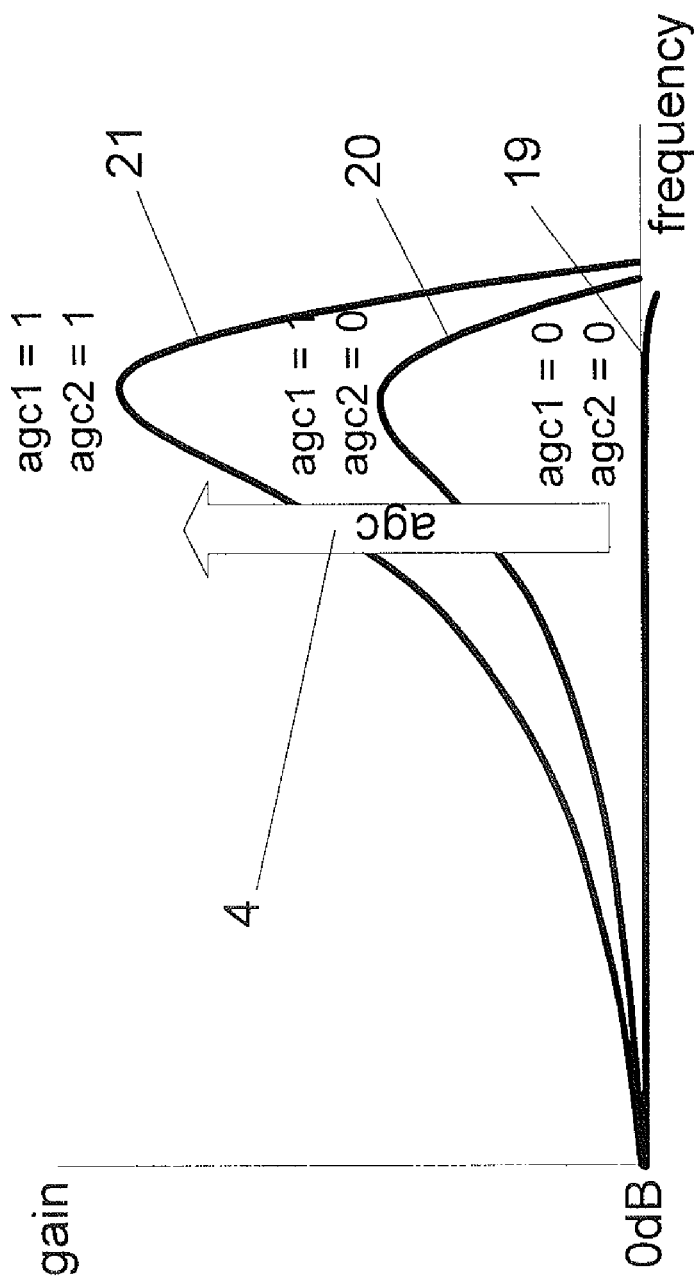
FIG. 4 is a graph showing two different transfer functions of a multi-stage adaptive equalizer corresponding to the maximum activation of each of its two gain boosting stages.

FIG. 4 shows an example of the transfer function implemented by the two-stage adaptive equalizer of FIG. 3. Three different transfer functions 19, 20, 21 are shown, corresponding to three sets of values of the automatic gain control signals agc1 17 and agc2 18. When the adaptation factor $\alpha$ (implemented here by the gain control signal agc 4) is at its minimum value, both signals agc1 17 and agc2 18 are at their minimum values, and neither gain stage is active, resulting in a transfer function with flat gain as shown in the first transfer function 19. As the automatic gain control signal agc 4 increases, the first gain control signal agc1 17 increases from 0 to 1, resulting in the gradual activation of the first gain stage 15 until it reaches its maximum gain, shown by the second transfer function 20. As the automatic gain control signal agc 4 continues to increase, the second gain control signal agc2 18 increases from 0 to 1, resulting in the gradual activation of the second gain stage 16 until it reaches its maximum gain, shown by the third transfer function 21.

Figure 5:
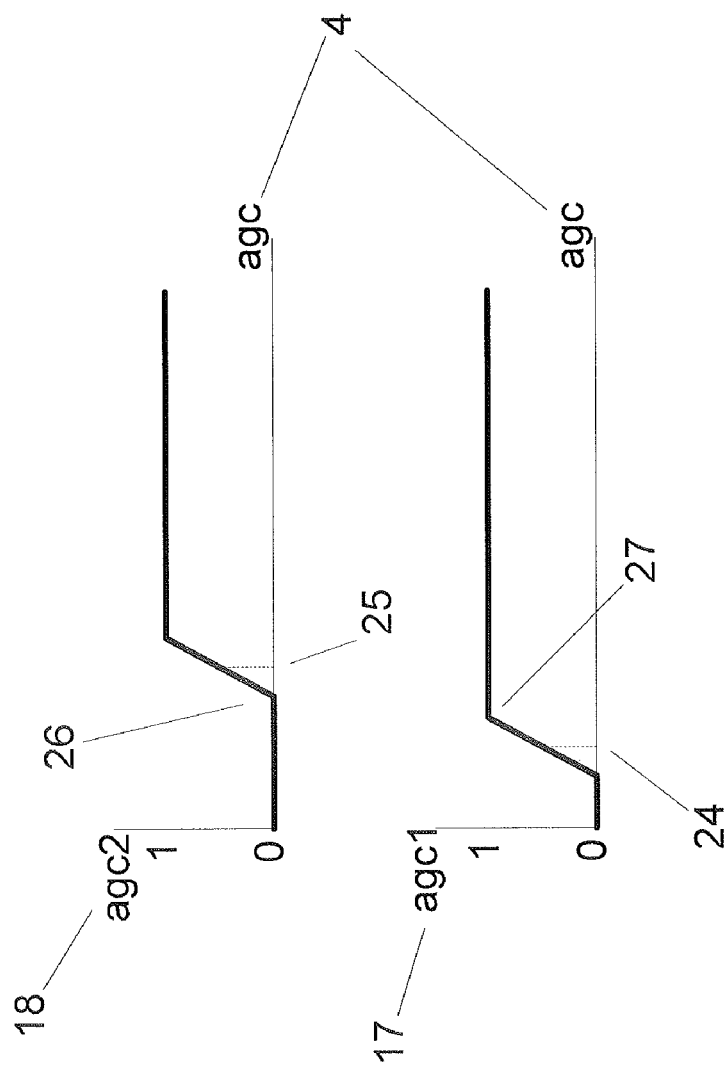
FIG. 5 is a graph showing how the gain control signals in the multiple-stage equalizer core of FIG. 1 are adjusted according to the length of the transmission medium.

FIG. 5 shows how the gain control signals 17, 18 in the two-stage equalizer 14 from the previous two figures are adjusted by an automatic gain control loop according to the value of the agc signal 4. The signals agc1 17 and agc2 18 are generated by comparing the primary agc signal 4 to a first agc1 reference level 24 and a second agc2 reference level 25 (indicated by the dotted lines) and gradually increasing the value of the corresponding gain control signal 17,18 as agc 4 approaches and exceeds the signal's reference level 24, 25. In this example, agc2 18 does not begin to increase in value 26 until agc1 17 has reached its maximum level 27.

A further refinement of the multi-stage adaptive equalizer 14 incorporates one or more bandwidth-limited stages that apply additional low-frequency gain only to low-bandwidth transmissions, thereby limiting the bandwidth of the signal 9 but increasing the gain without a corresponding increase in high-frequency noise. One or more initial, variable-bandwidth gain boosting stages are applied first until they are at their maximum gain, this maximum gain representing a high-frequency noise threshold; after that point, the bandwidth of these variable-bandwidth stages is reduced and one or more low-bandwidth gain boosting stages are applied, effectively shifting the maximum gain peak toward lower frequencies and filtering out higher frequencies. The equalizer uses an automatic gain control loop to modulate the gain of each of these gain boosting stages and to limit the bandwidth of the variable-bandwidth gain boosting stages. Such a multi-rate adaptive equalizer exhibits a trade-off between the maximum bandwidth of the signals it equalizes and the maximum cable length over which they may be transmitted.

Figure 6:
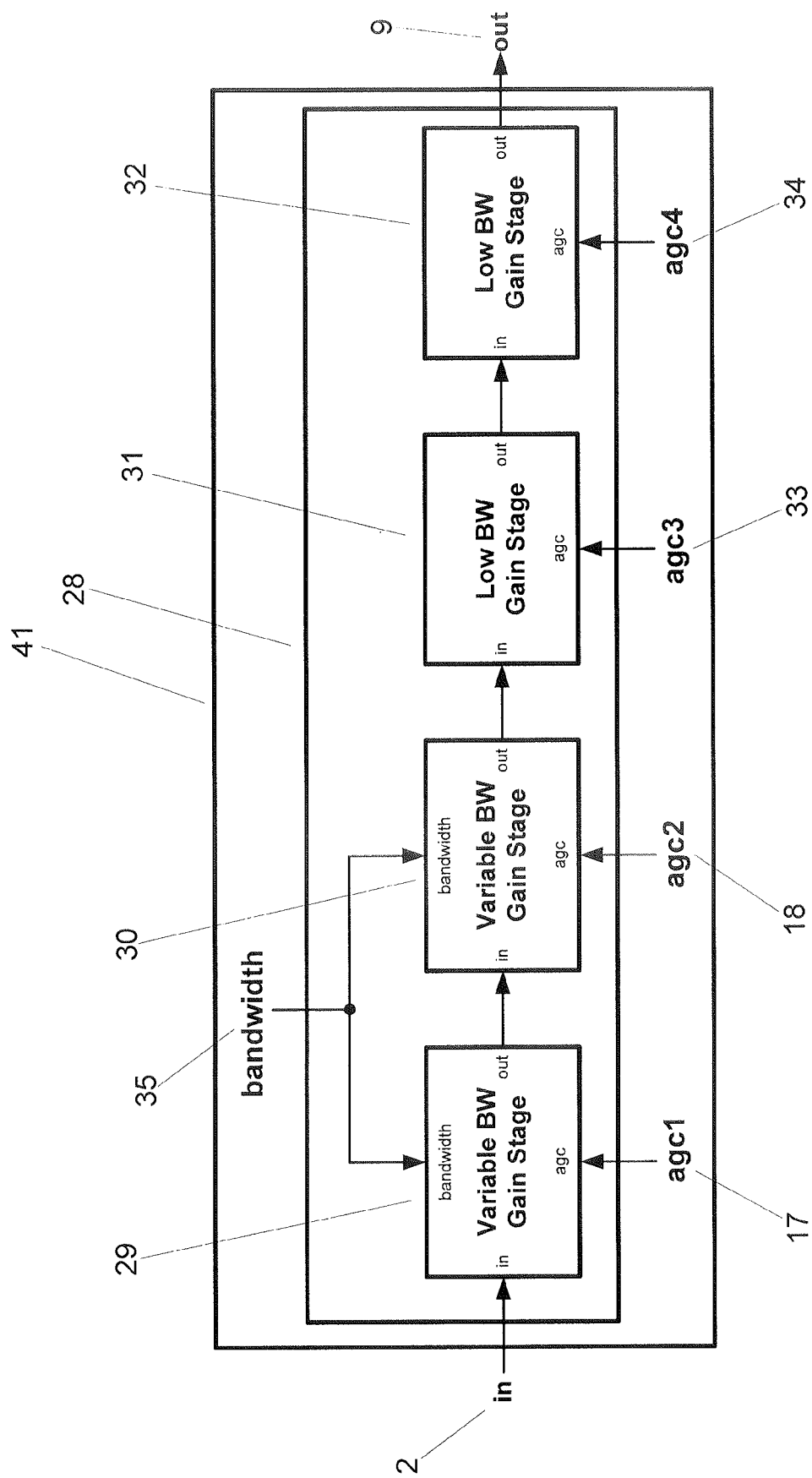
FIG. 6 is a block diagram showing a multi-rate adaptive equalizer core with four stages in which the first two stages implement the variable-bandwidth transfer function $G_{HBW}(S)$ and the last two stages implement the low-bandwidth transfer function $G_{LBW}(S)$.

Referring to the drawings, FIG. 6 shows the operation of an example of a multi-rate adaptive equalizer 41, consisting of an equalizer core 28 controlled by gain and bandwidth control signals 17, 18, 33, 34, 35. The received signal 2 is boosted by the transfer function of each of four gain boosting stages 29-32 in sequence, producing an equalized output signal 9. The gain of the transfer function of the first variable-bandwidth gain boosting stage 29 is controlled by the automatic gain control signal agc1 17. The gain of the transfer function of the second variable-bandwidth gain boosting stage 30 is controlled by the automatic gain control signal agc2 18. The gain of the transfer function of the first low-bandwidth gain boosting stage 31 is controlled by the automatic gain control signal agc3 33. The gain of the transfer function of the second low-bandwidth gain boosting stage 32 is controlled by the automatic gain control signal agc4 34. The bandwidth of the transfer functions of the two variable-bandwidth stages 29, 30 is controlled by the bandwidth limit signal 35.

Figure 7:
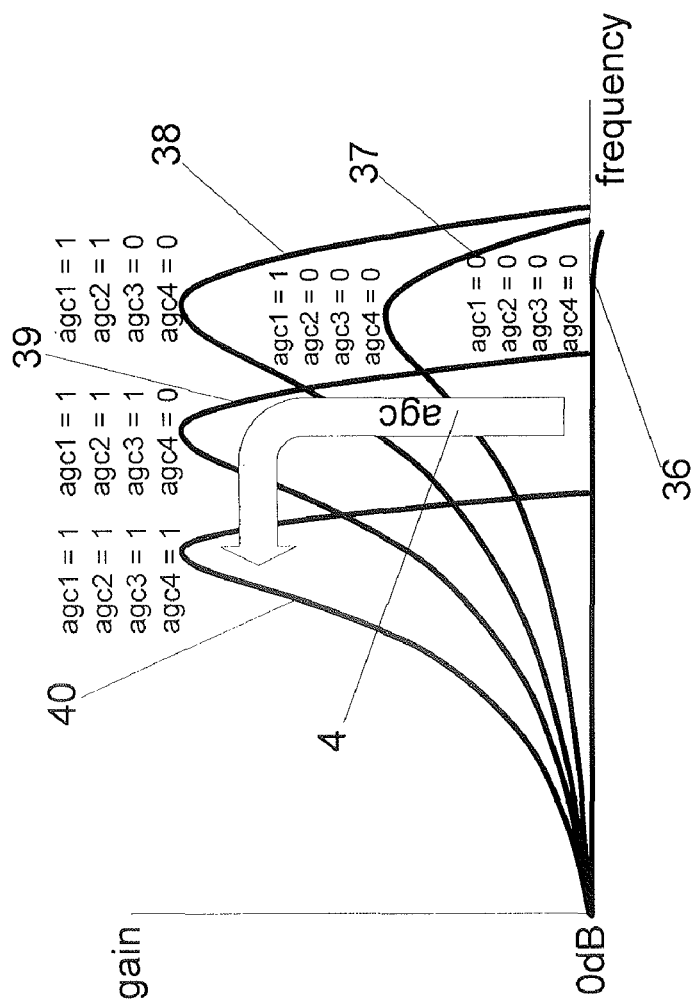
FIG. 7 is a graph showing five different transfer functions of a multi-rate adaptive equalizer corresponding to the maximum activation of each of its four sequential gain boosting stages and the inactivation of all four stages.

FIG. 7 shows a graph illustrating the overall transfer function of the multi-rate adaptive equalizer core 28 as the automatic gain control signal agc 4 increases. Five different transfer functions 36-40 are shown, corresponding to five different sets of values for the automatic gain control signals agc1 17, agc2 18, agc3 33, and agc4 34. The first transfer function 36 corresponds to the point where the four automatic gain control signals 17, 18, 33, 34 are at their minimum values: agc1=0, agc2=0, agc3=0, and agc4=0. This first transfer function 36 is essentially unity gain at all frequencies, except at very high frequencies where it is attenuated to eliminate high-frequency noise. The second transfer function 37 corresponds to the point where the first automatic gain control signal 17 has reached its maximum value: agc1=1, agc2=0, agc3=0, and agc4=0. The third transfer function 38 corresponds to the point where the second automatic gain control signal 18 has reached its maximum value: agc1=1, agc2=1, agc3=0, and agc4=0. The fourth transfer function 39 corresponds to the point where the third automatic gain control signal 33 has reached its maximum value: agc1=1, agc2=1, agc3=1, and agc4=0. The fifth transfer function 40 corresponds to the point where the four automatic gain control signals 17, 18, 33, 34 are all at their maximum values: agc1=1, agc2=1, agc3=1, and agc4=1. The fourth 39 and fifth 40 transfer functions exhibit the effect of activating the low-bandwidth gain boosting stages 31, 32 and limiting the bandwidth of the variable-bandwidth stages 29, 30 using the bandwidth control signal 35, which begins after the second variable-bandwidth boosting stage 30 has reached its maximum gain: the bandwidth of the signal 9 is shifted downward, but the low-frequency gain is increased.

Figure 8:
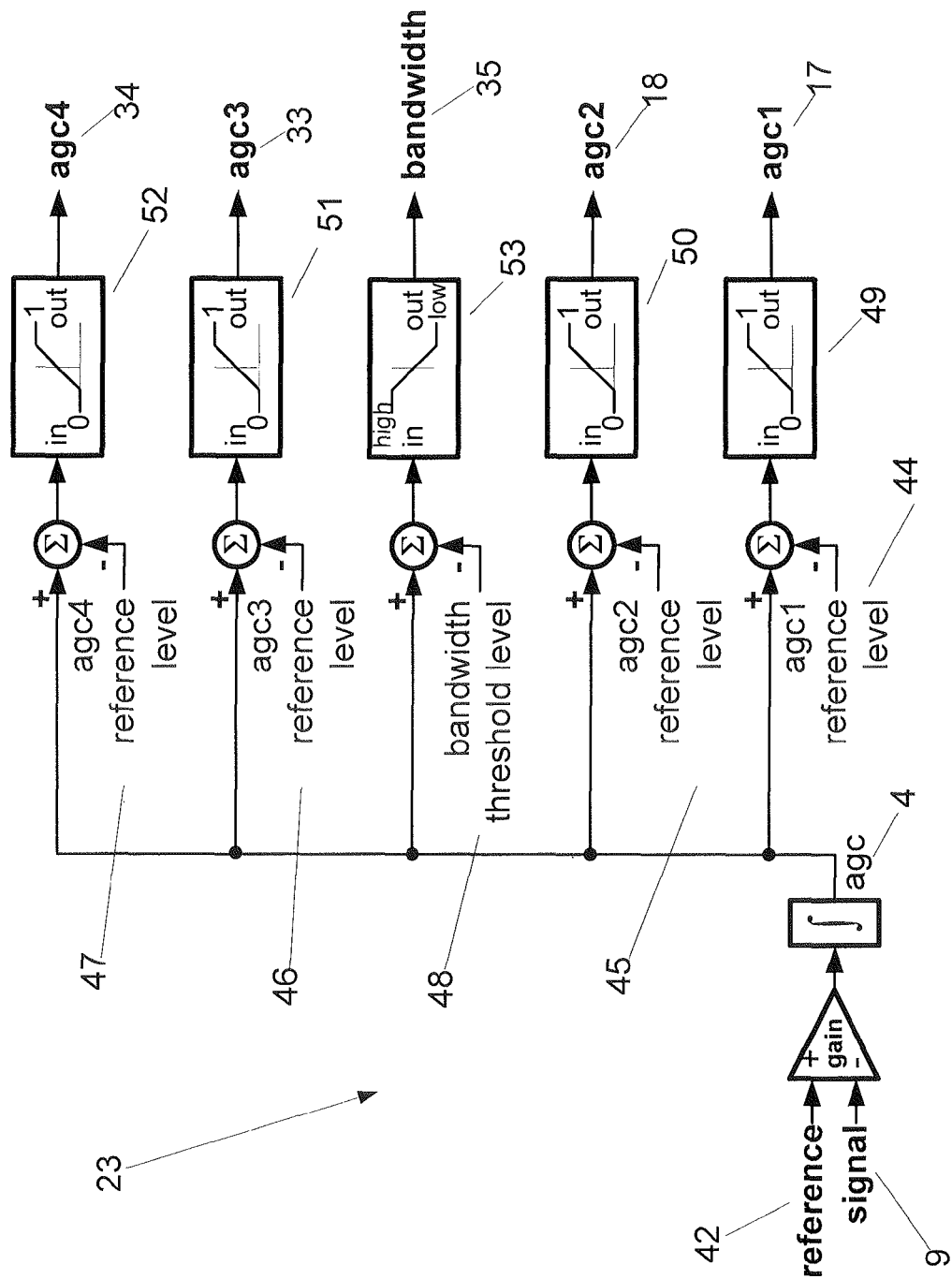
FIG. 8 is a block diagram showing the generation of four gain control signals and a bandwidth control signal in a multi-rate adaptive equalizer automatic gain control loop.

FIG. 8 illustrates a gain control loop 23 for providing agc signals agc1, agc2, acg3 and agc4 and the bandwidth signal 35 in the multi-rate adaptive equalizer 41. The output signal 9 is fed back to the automatic gain control loop 23 and compared to a reference 42, generating a primary automatic gain control signal agc 4 corresponding to the adaptation factor α. This primary automatic gain control signal 4 is then compared to five different reference levels 44-48 and has five different transfer functions 49-53 applied to it to generate the four automatic gain control signals agc1 17, agc2 18, agc3 33, and agc4 34, and the bandwidth limit signal 35.

Figure 9:
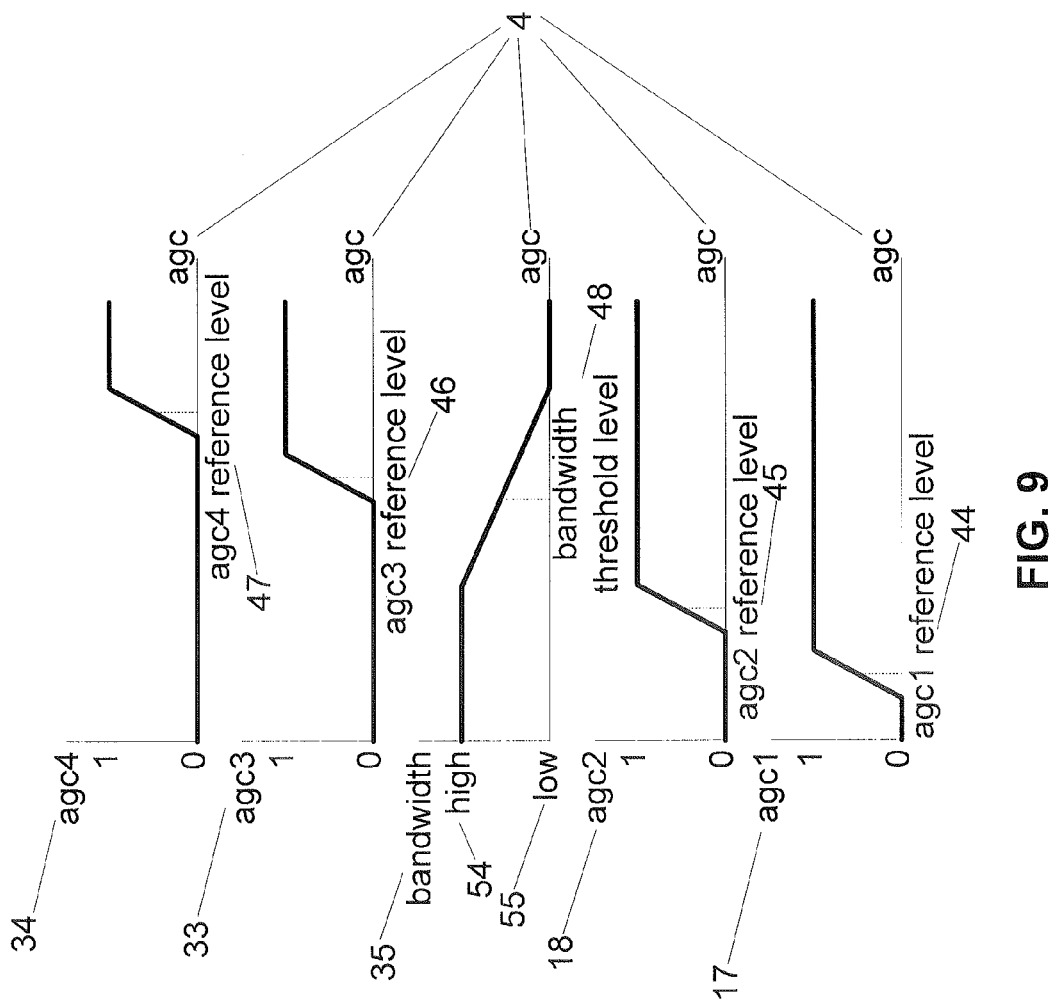
FIG. 9 is a graph showing how the gain control signals and the bandwidth limit signal in the multiple-stage equalizer core are adjusted according to the value of the primary gain control signal agc.

FIG. 9 shows four graphs plotting the signals agc1 17, agc2 18, agc3 33, agc4 34, and the bandwidth limit signal 35 generated by the gain control loop 23 of a multi-rate adaptive equalizer 41. The values of the signals 17, 18, 33, 34, 35 are each plotted on the Y axis, with the primary gain control signal agc 4 plotted on the X axis. The dotted lines indicate the reference levels 44-48 for the five signals 17, 18, 33, 34, 35. These graphs illustrate the operation of the five signals 17, 18, 33, 34, 35 as the primary gain control signal 4 rises in value. All four gain control signals 17, 18, 33, 34 begin at their minimum value of zero, while the bandwidth limit signal 35 begins at a high-bandwidth limit 54. As agc 4 rises in value, first agc1 17 rises from 0 to 1, then agc2 18 rises from 0 to 1, then the bandwidth limit signal 35 starts to decrease toward a low-bandwidth limit 55 while agc3 33 rises from 0 to 1, and finally the bandwidth limit signal 35 continues to decrease toward a low-bandwidth limit 55 while agc4 34 rises from 0 to 1. This accounts for the different transfer functions 36-40 of the equalizer core 28 as agc 4 increases in value, as illustrated in FIG. 7.

Figure 10:
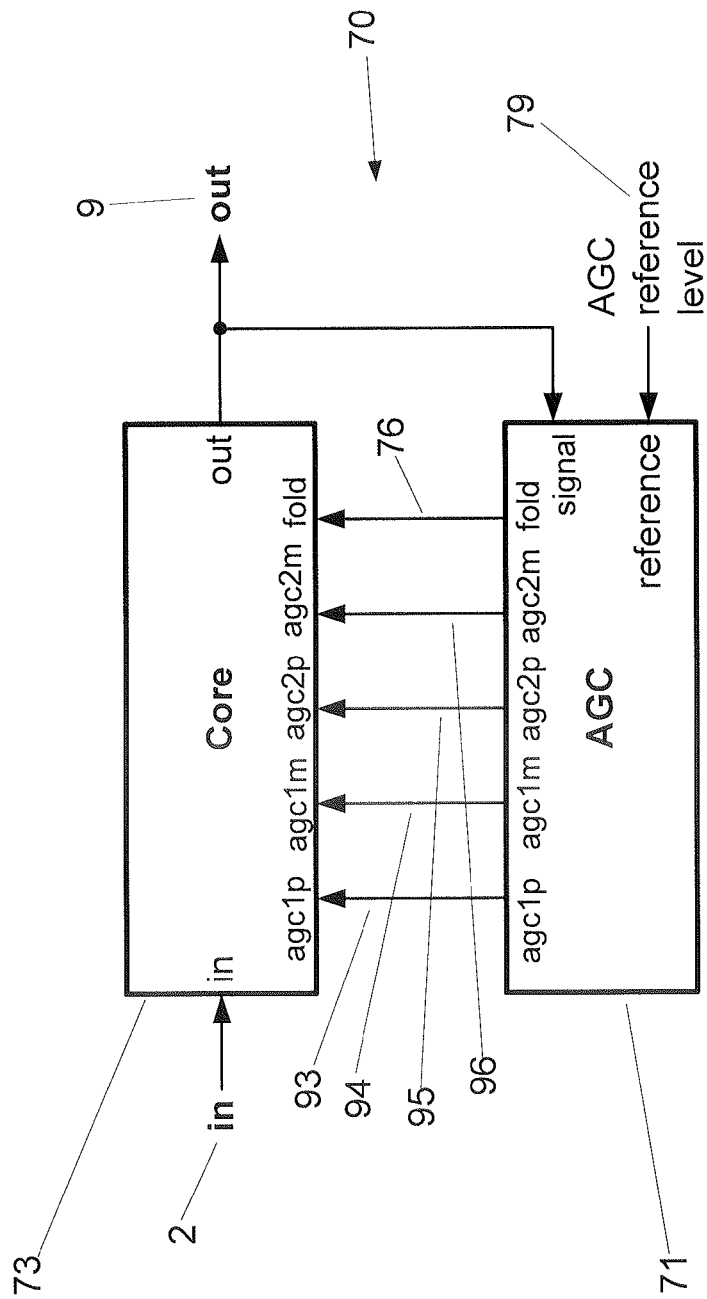
FIG. 10 is a block diagram showing a sequential folding multi-rate adaptive equalizer according to an example embodiment of the invention.

A general description of examples of adaptive equalizers having been provided, specific features will now be described in accordance with example embodiments of the invention. In this regard, FIG. 10 is a block diagram illustration of a sequential folding multi-rate adaptive equalizer 70 according to an example embodiment of the invention. The folding multi-rate adaptive equalizer 70 compensates for signal loss resulting from transmission through non-ideal media by applying a transfer function whose gain and bandwidth profile varies depending on the characteristics of the received signal, and which makes use of a folding function to use the same gain boosting circuits to boost both high-bandwidth and low-bandwidth signals. The adaptive equalizer 70 includes an automatic gain control loop 71 and an equalizer core 73.

The sequential multi-rate folding adaptive equalizer 70 uses folding automatic gain control loop 71 to apply additional gain to low-bandwidth signals without resort to additional low-bandwidth gain boosting stages implemented as distinct gain boosting circuitry. The equalizer core 73 operates by using the same boosting circuitry that applied the initial variable-bandwidth gain stages to frequency-scale its transfer function downward as additional low-bandwidth gain is required beyond an initial high-frequency gain threshold. This is accomplished by activating a folding signal 76 that switches on when a high-bandwidth circuit path reaches its maximum gain, opening a low-bandwidth gain control circuit path that increases in usage as the amount of additional low-bandwidth gain required increases.

Figure 13:
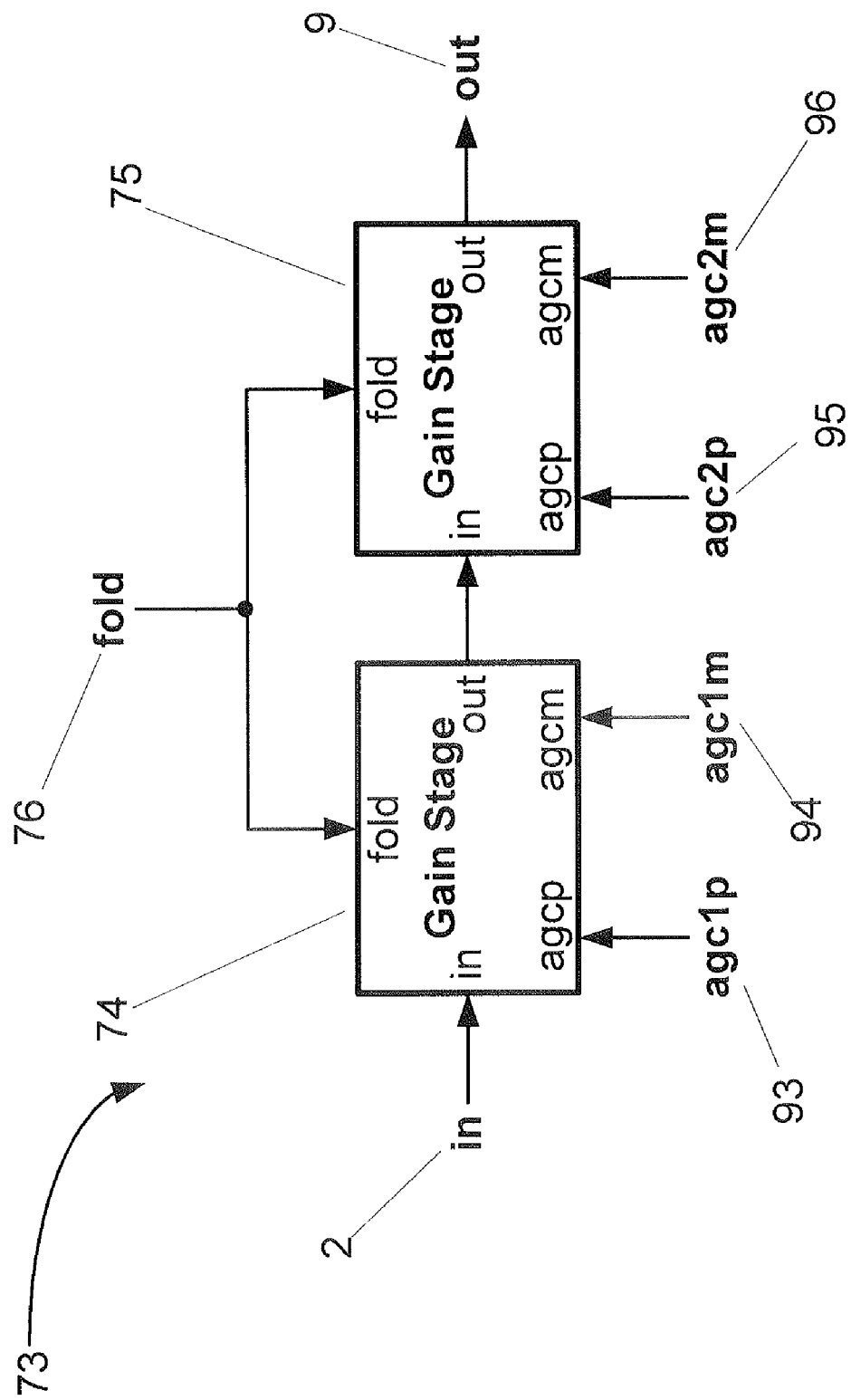
FIG. 13 is a block diagram showing a folding multi-rate adaptive equalizer core of the equalizer of FIG. 10.

FIG. 13 illustrates an example embodiment of the equalizer core 73 in greater detail. In the illustrated embodiment, the equalizer core 73 includes two variable frequency gain stages 74 and 75.

FIG. 17 shows an example set of differential transistor pairs and simple Resistor-Capacitor ("RC") circuits implementing a gain stage 74 or 75 that can be used to implement the equalizer core 73 of FIG. 13. The gain stage 74 includes a high bandwidth circuit path 119 and a low bandwidth circuit path 121, with switching between the paths being triggered by the folding signal 76. The switch from the high bandwidth circuit path 119 to the low bandwidth circuit path 121 triggered by the folding signal 76 is not a hard switch, as at the onset of switching, the signal agcm 94 that modulates the low bandwidth gain boosting stage has already reached its minimum level of zero (corresponding to maximum value of 1 for the parameter α). Once more low frequency gain boosting is required, the agcm 94 signal starts to increase and causes a soft switch from the high bandwidth signal path to a low bandwidth signal path. Using a soft switch eliminates any discontinuity in the signal path and avoids the need for re-adaptation of the gain control loop 71. In addition to avoiding any discontinuities, the smooth reduction in the bandwidth caused by the soft switch alleviates recovery from loop lock-up should it happen on the onset of start-up.

In an example embodiment, the transfer function applied to the received signal 2 by each gain stage of the equalizer core 73 is characterized by the equation:

$$1+\alpha G_{HBW}(s)+F(1-\alpha)G_{LBW}(s)$$

In this expression, the constant term 1 represents the unity gain flat frequency response. The high frequency gain is implemented by a high bandwidth and a low bandwidth version of the boosting transfer function (HBW and LBW). F is the logical value 1 or 0 corresponding to the folding signal while activated or deactivated respectively. The value α (between 0 and 1) implements the adaptation mechanism, as in the known multi-rate adaptive equalizer 41 described in the previous section. If the adaptation loop 71 decides to only utilize the gain available from the first gain stages of equalization 74,75 without folding, the folding signal 76 is disabled (F=0), and the equalizer 70 applies an appropriate amount of gain with a high bandwidth signal pass to support high data rate operation. In this regime, the implemented transfer function is simply $1+\alpha G_{HBW}(s)$, with α ranging in value from 0 to 1. (This transfer function can thus be viewed as an interpolation between two extreme cases of 1 and $1+G_{HBW}(s)$, depending on the value of α.) As more gain is needed at lower frequencies, the adaptation loop 71 will pass the folding threshold 78 and enable the folding signal. Once the folding signal 76 is enabled (F=1), the transfer function changes to:

$$1+\alpha G_{HBW}(s)+(1-\alpha)G_{LBW}(s)$$

In this example embodiment, the activation of the folding signal 76 that occurs at the folding threshold 78 enables a soft switch between transfer functions. On the onset of activating the folding signal 76, the adaptation parameter a is already at its maximum value of 1 such that the transfer function just before and just after folding is the same: $1+G_{HBW}(S)$. This soft switch ensures a smooth switch from the no-folding regime to the folding regime with no abrupt change to the response of the equalizer filter and consequently to the behaviour of the adaptation loop 71. Once the folding signal 76 is active, the direction of a changes, and as adaptation continues to push the equalizer 70 towards applying more gain, a starts to move in the reverse direction from 1 down to 0. The transfer function starts to deviate from its extreme high bandwidth expression of $1+G_{HBW}(s)$ and gradually approaches its extreme low bandwidth expression of $1+G_{LBW}(S)$. In this folded regime, the equalizer transfer function can be viewed as an interpolation between the two extreme cases of the maximum gain of the high bandwidth transfer function and the maximum gain of the low bandwidth transfer function.

Figure 11:
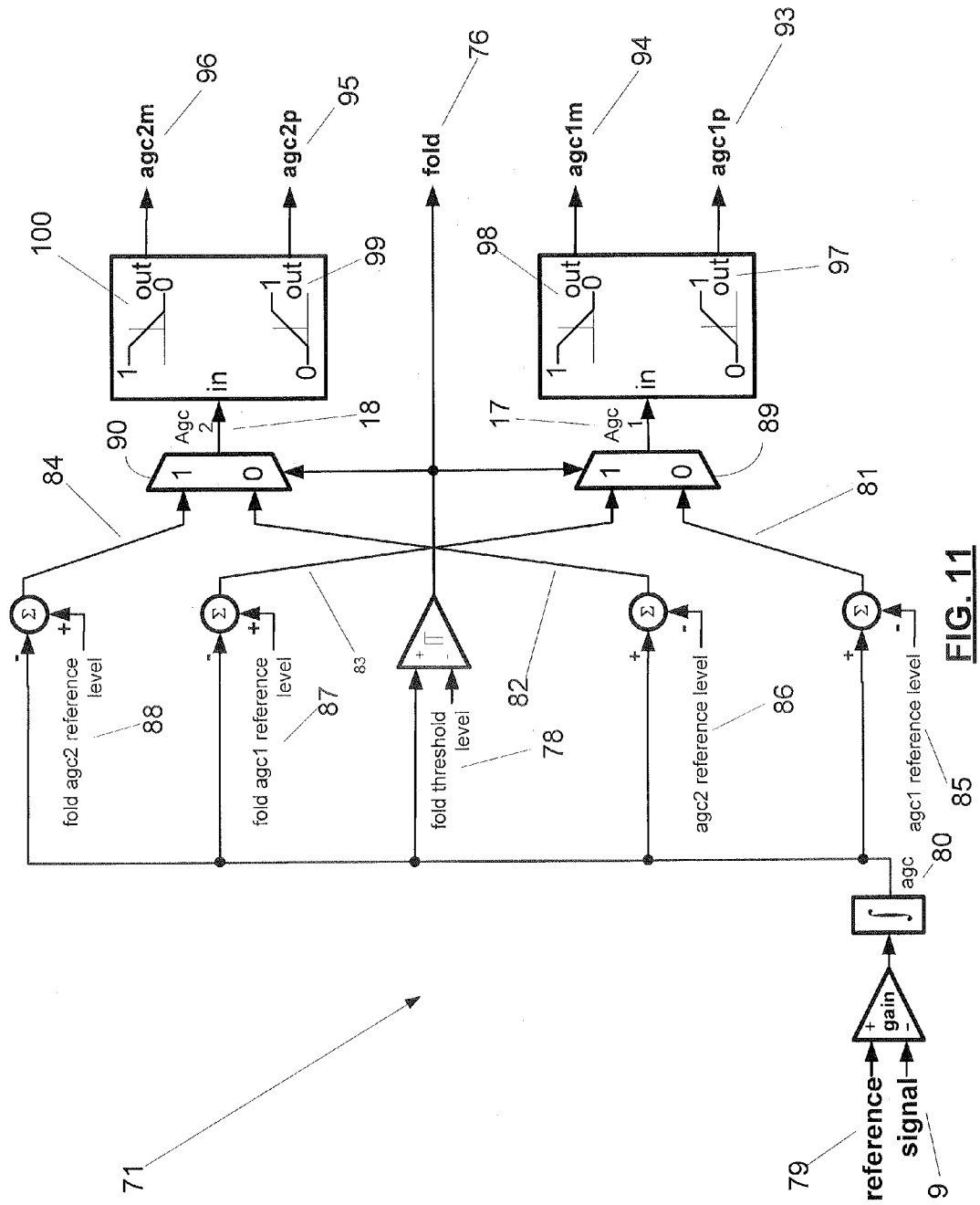
FIG. 11 is a block diagram showing an automatic gain control loop of the sequential folding multi-rate adaptive equalizer of FIG. 10.

Referring to the drawings, FIG. 11 shows the operation of the gain control loop 71 of the folding multi-rate adaptive equalizer 70 according to an example embodiment. The output signal 9 from the equalizer 70 is fed back to the automatic gain control loop 71 and compared to a reference 79, and the resulting signal integrated to generate a primary automatic gain control signal, agc 80. This primary agc signal 80 corresponds to the adaptation factor α during the unfolded regime; once the folding signal 76 is activated, however, further increases in the primary agc signal 80 act to decrease, rather than increase, the adaptation factor α.

This primary automatic gain control signal agc 80 is compared to four different reference levels 85-88 to generate two unfolded gain control signals—unfolded agc1 81 and unfolded agc2 82—and two folded gain control signals—folded agc1 83 and folded agc2 84. The primary signal agc 80 is also compared to a fold threshold level 78 to generate the fold signal 76. Thus, the value of agc 80 at the fold threshold 78 corresponds to the maximum value of α, α=1. After agc 80 passes the fold threshold 78, α begins to decrease back to its minimum value of 0.

The value of the fold signal 76 is fed into two logic gates 89, 90 to determine whether the folded 83, 84 or unfolded 81, 82 values of agc1 and agc2 are used to generate the final gain control signals agc1 17 and agc2 18: if the fold signal 76 is active (F=1), the folded values of agc1 83 and agc2 84 are used, and if the fold signal 76 is inactive (F=0), the unfolded values of agc1 81 and agc2 82 are used. This folded 83 or unfolded 81 version of the signal agc1 17 is then split into a first version agc1p 93 with a first polarity, and a second version agc1m 94 with a second polarity opposite to the first, by the application of a pair of transfer functions 97, 98. Likewise, the folded 84 or unfolded 82 version of the signal agc2 18 is split into a first version agc2p 95 with a first polarity, and a second version agc2m 96 with a second polarity opposite to the first, by the application of a pair of transfer functions 99, 100.

Figure 12:
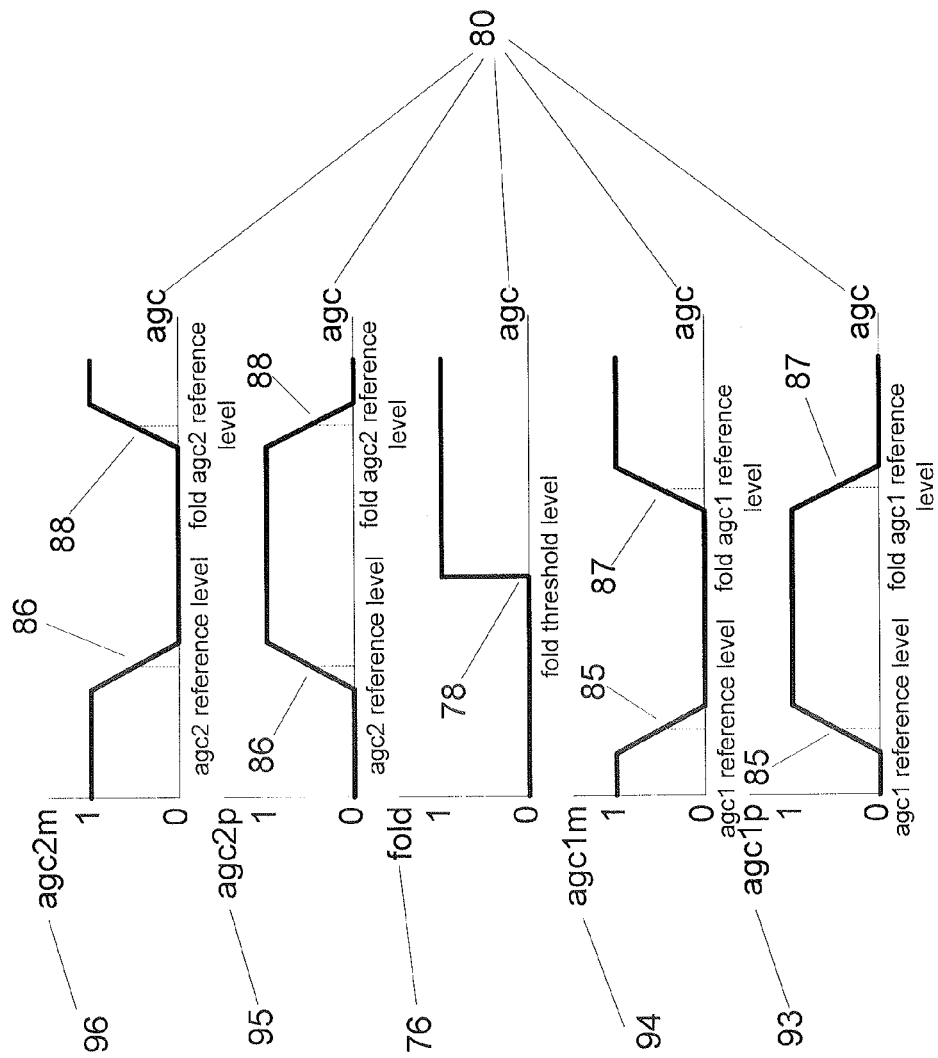
FIG. 12 is a graph showing the levels of four gain control signals and one folding signal plotted against the primary automatic gain control signal in the folding multi-rate adaptive equalizer automatic gain control loop of FIG. 11.

Referring again to the drawings, FIG. 12 shows five graphs plotting the signals agc1p 93, agc1m 94, agc2p 95, agc2m 96, and the fold signal 76 generated by the gain control loop 71 of an example folding multi-rate adaptive equalizer 70. The value of the signals 76, 93-96 is plotted on the Y axis, with the primary gain control signal agc 80 plotted on the X axis. The dotted lines indicate the unfolded 85, 86 and folded 87, 88 reference levels for the signals agc1 17 and agc2 18. These graphs illustrate the operation of the five signals 76, 93-96 as the primary gain control signal agc 80 rises in value. Here, the response of the signals 76, 93-96 to a rising primary gain control signal agc 80 differs from the response shown in the graph of the previously discussed multi-rate adaptive equalizer 41 gain control loop 23 shown in FIG. 9.

In this example embodiment of a folded equalizer 70, the signals agc1p 93 and agc2p 95 are at their minimum value of zero when agc 80 is at zero, while the reverse-polarity versions of these signals, agc1m 95 and agc2m 96, are at their maximum value of one. The fold signal 76 is at its inactive value of zero. As agc 80 rises in value, first agc1p 93 rises from 0 to 1 as agc1m 94 correspondingly falls from 1 to 0. Then agc2p 95 rises from 0 to 1 as agc2m 96 correspondingly falls from 1 to 0. After this point, the fold signal 76 is activated, switching in value from 0 to 1. As agc 80 continues to rise in value after the activation of the fold signal 76, agc1p 93 begins to fall from 1 to 0 as agc1m 94 correspondingly rises from 0 to 1. Then agc2p 95 begins to fall from 1 to 0 as agc2m 96 correspondingly rises from 0 to 1.

These various gain control signals 93-96 are then fed into the two gain stages 74, 75, depicted in the block diagram of FIG. 13, of equalizer 70. The two opposite-polarity signals agc1p 93 and agc1m 94 are used as inputs to the first gain stage 74, and the two opposite-polarity signals agc2p 95 and agc2m 96 are used as inputs to the second gain stage 75. The fold signal 76 is also used as an input to both stages 74, 75. The incoming signal 2 is fed through each of the two stages 74, 75 in sequence, and each stage 74, 75 applies a transfer function to the signal 2, resulting in an output signal 9 intended to duplicate the pre-transmission signal without the distortion introduced by the transmission medium.

Within each gain stage 74, 75, a high bandwidth transfer function $G_{HBW}(S)$ modulated by the positive-polarity gain control signal (agc1p 93 or agc2p 95) is applied to the incoming signal 2. If the folding signal 76 is active, a low bandwidth transfer function $G_{LBW}(S)$ modulated by the negative-polarity gain control signal (agc1m 94 or agc2m 96) is applied as well. This application of either one or both transfer functions to the incoming signal 2 produces a total transfer function characterized by the equation noted above:

$$1+\alpha G_{HBW}(s)+F(1-\alpha)G_{LBW}(s)$$

where F is the fold signal 76, $\alpha G_{HBW}(s)$ represents the total transfer function produced by the positive gain control signals agc1p 93 and agc2p 95, and $(1-\alpha)G_{LBW}(s)$ represents the total transfer function produced by the negative gain control signals agc1m 95 and agc2m 96.

Figure 14:
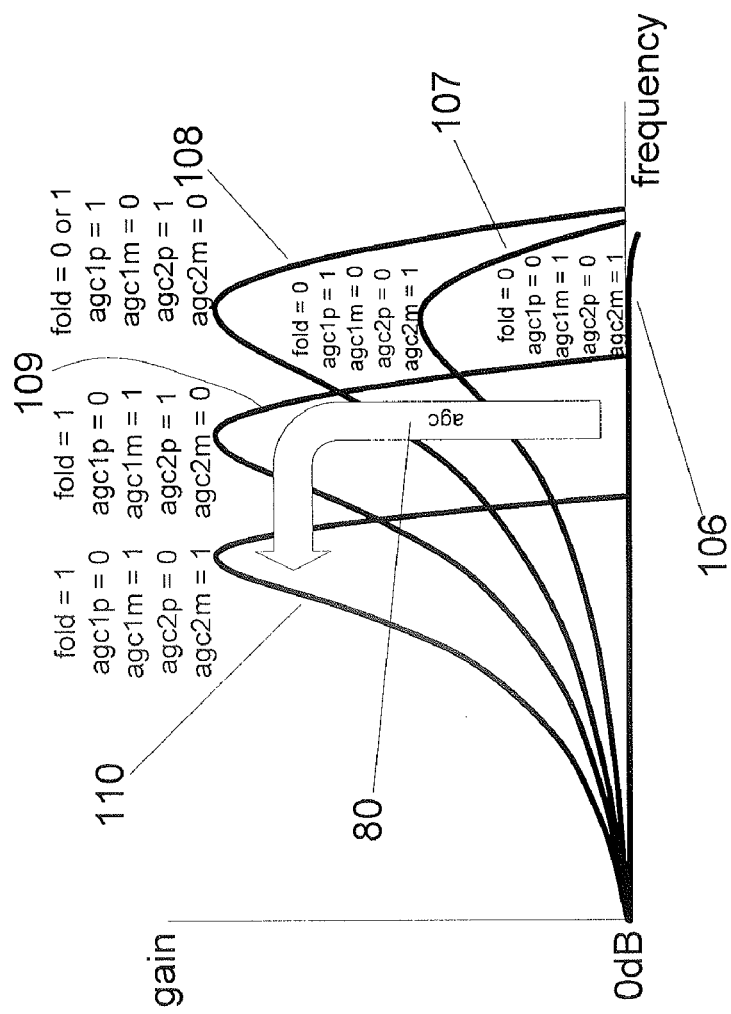
FIG. 14 is a graph illustrating examples of five different transfer functions of the folding multi-rate adaptive equalizer of FIG. 10.

The total transfer function applied by the two gain stages 74, 75, with and without folding, is illustrated in FIG. 14. The drawing, plotted with gain on the Y axis and frequency on the X axis, shows five different transfer functions 106-110 corresponding to five different sets of values for the folding signal 76 and the four gain control signals agc1p 93, agc1m 94, agc2p 95, and agc2m 96. These five different sets of values correspond to five different values of the primary gain control signal agc 80. The first transfer function 106 shows a unity gain flat response, where agc 80 is at its minimum value: the fold signal 76 is at its inactive value of zero, the signals agc1p 93 and agc2p 95 are at their minimum values of zero, and the reverse-polarity signals acg1m 94 and agc2m 96 are correspondingly at their maximum values of one. As agc 80 rises, the value of agc1p 93 rises from 0 to 1 and agc1m 94 falls from 1 to 0, resulting in the second transfer function 107. As agc 80 continues to rise past this point, acg2p 95 rises from 0 to 1 and agc2m 96 falls from 1 to 0, resulting in the third function 108. As the agc 80 continues to rise and passes the fold threshold 78, the fold signal 76 changes its value; however, at this point, the value of the fold signal 76 does not affect the profile of the transfer function, as the negative-polarity signals agc1m 94 and agc2m 96, whose transfer functions are switched on by the fold signal 76, are at zero value. Thus, when the fold signal 76 is activated at this threshold 78, it does not create any discontinuities in the paths of the gain control signals 93-96 or the output signal 9 itself, thereby resulting in a smooth adaptation response and gain control loop response. As agc 80 continues to increase after the folding signal 76 has been activated, the value of agc1p 93 falls from 1 to 0 and agc1m 94 rises from 0 to 1, resulting in the fourth transfer function 109. Finally, as agc 80 continues to increase to its maximum value, the value of agc2p 95 falls from 1 to 0 and agc2m 96 rises from 0 to 1, resulting in the fifth transfer function 110.

In an example folding multi-stage adaptive equalizer, the first 106 through fifth 110 transfer functions taken in sequence exhibit a monotonic increase in low-frequency gain, measured in decibels. Similarly, in one embodiment of the two-stage folding adaptive equalizer described above, the first 106 through third 108 transfer functions taken in sequence exhibit a monotonic increase in high-frequency gain. In such an embodiment, the sequence of pre-folding gain stages exhibit monotonic gain increases across all frequencies, while the post-folding gain stages continue to exhibit a monotonic gain increase only for low frequencies.

Figure 15:
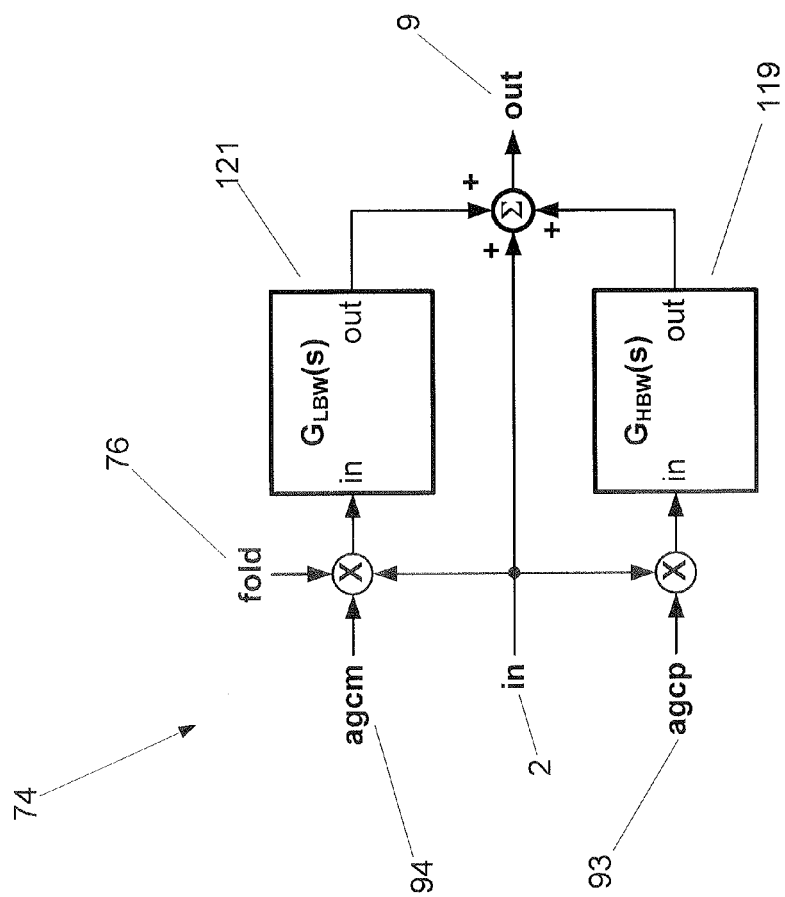
FIG. 15 is a block diagram showing a single gain stage of a folding multi-rate adaptive equalizer core of FIG. 13.
Figure 15A:
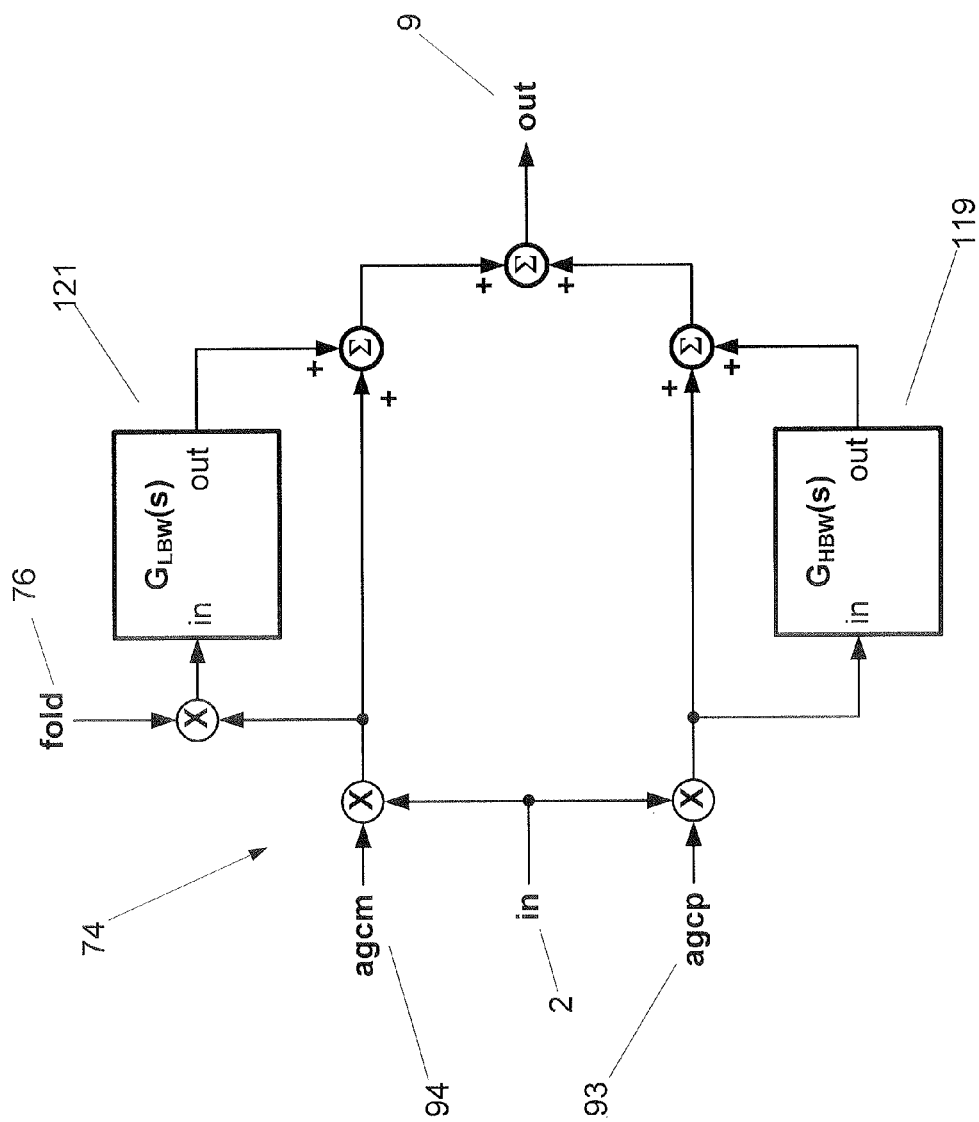
FIG. 15a is a block diagram showing an alternate embodiment of a single gain stage of a folding multi-rate adaptive equalizer core of FIG. 13.

The operation of a single gain stage in an example folding multi-stage equalizer core 73 is illustrated by the block diagram of FIG. 15. The gain stage 74 receives an input signal 2, a fold signal 76, and two gain control signals of opposite polarity, agcp 93 and agcm 94 (corresponding to agc1$p$ and agc1$m$, respectively of FIG. 13). When little or no gain is required, the fold signal 76 is inactive. As the positive-polarity gain control signal agcp 93 increases in voltage, it feeds a high-bandwidth gain boost pathway 119 that produces the high-bandwidth transfer function $G_{HBW}(S)$ modulated by the positive-polarity gain boost signal agcp 93. The output of this high-bandwidth boost stage 119 is summed with the input signal 2 to produce an output signal 9. When agcp 93 reaches its maximum voltage, agcpm 94 is at its minimum voltage, and at this point the fold signal 76 is activated if further low-bandwidth gain is required. The activation of the fold signal 76 opens a low-bandwidth gain boost pathway 121 producing a low-bandwidth transfer function $G_{LBW}(S)$ modulated by the negative-polarity gain boost signal agcm 94. As more gain is needed, agcp 93 decreases in voltage from its maximum value as agcpm 94 increases from its minimum value, thereby decreasing the amount of high-bandwidth gain produced by the high-bandwidth boost pathway 119 but increasing the amount of low-bandwidth gain produced by the low-bandwidth boost pathway 121. The low-bandwidth gain produced by the low-bandwidth boost pathway 121 is summed, along with any high-bandwidth gain still being produced by the high-bandwidth pathway 119, with the input signal 2 to produce the output signal 9.

An alternative embodiment of a single gain stage is illustrated by the block diagram of FIG. 15$a$. Here, both the high-bandwidth gain boost pathway 119 that produces the high-bandwidth transfer function $G_{HBW}(S)$ and the low-bandwidth gain boost pathway 121 that produces the low-bandwidth transfer function $G_{LBW}(S)$ each operates in parallel with its own flat gain path producing a flat gain response. Since these two pathways are modulated by the positive-polarity gain boost signal agcp 93 and the negative-polarity gain boost signal agcm 94, which are always at inverse values, the overall transfer function produced by this gain stage is identical to that produced by the stage of FIG. 15, which shares a single unity-gain path between the two gain boost pathways unmodulated by any gain control signal. Whereas the transfer function of the stage in FIG. 15 can be characterized as $1+\alpha G_{HBW}(s)+F(1-\alpha)G_{LBW}(s)$, the transfer function of FIG. 15$a$ can be characterized by the mathematically identical $\alpha+\alpha G_{HBW}(s)+(1-\alpha)+F(1-\alpha)G_{LBW}(s)$, which simplifies to the same expression $1+\alpha G_{HBW}(s)+F(1-\alpha)G_{LBW}(s)$. While the choice to implement a gain stage according to either FIG. 15 or FIG. 15$a$ might be made for various practical reasons, the invention applies to a gain stage implemented according to either figure.

Figure 16:
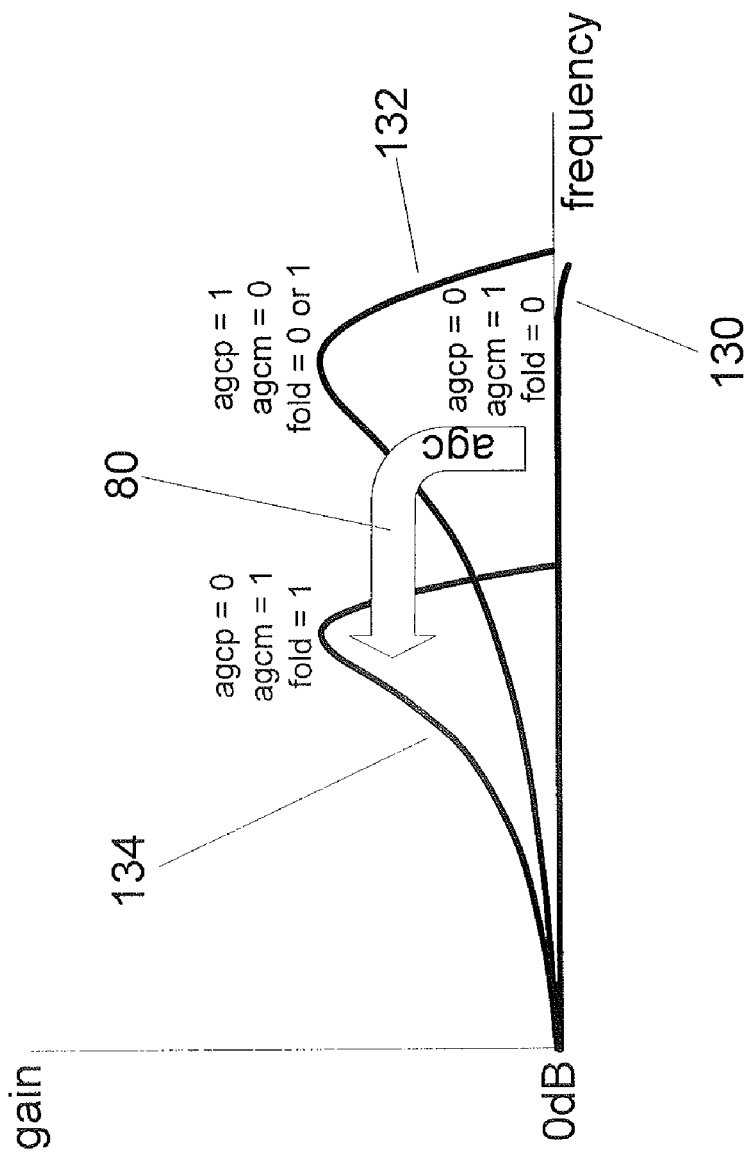

The transfer functions produced by a single folding gain stage as shown in either FIG. 15 or FIG. 15$a$ are shown in FIG. 16. When the primary gain control signal agc 80 is at its minimum value, indicating no signal attenuation and no need for gain, a first unity gain transfer function 130 is produced by the folding gain stage. As the value of agc 80 rises, indicating a need for high-bandwidth gain, the voltage of agcp 93 rises from its minimum value to its maximum, eventually creating a second transfer function 132 with a maximum high-bandwidth gain as the signal flowing through the high-bandwidth boost pathway 119 is at its maximum. If more gain is needed at this point, the fold signal 76 is activated, agcp 93 begins to fall back to its minimum value, and agcm 94 begins to rise from its minimum value toward its maximum, thereby shifting signal from the high-bandwidth boost pathway 119 to the low-bandwidth boost pathway 121 and effectively frequency-shifting the transfer function to the left, eventually resulting in a third transfer function 134 with maximum low-bandwidth gain.

With reference again to the drawings, FIG. 17 shows an example transistor-level circuit implementation 111 of one folding gain stage 74 corresponding to the block diagram of FIG. 15$a$. The input signal 2 is provided by positive 112 and negative 113 leads, and the output signal 9 is generated by its own positive 114 and negative 115 leads. The automatic gain control signal agc 122, measured relative to its positive and negative leads, corresponds to the gain control signal agcp 93: when the fold signal 76 is inactive, this agc signal 122 increases in voltage as the primary gain control signal 80 increases in voltage, and when the folding signal 76 is active, this signal 122 decreases in voltage as the primary gain control signal 80 continues to increase in voltage. By the same token, this agc signal 122 corresponds to the negative polarity gain control signal agcm 94 when measured with its negative and positive leads reversed. In this exemplary circuit implementation, a set of transistors 116,117 organized into differential pairs implements modulation of the gain boost transfer function. When agc 122 is at its baseline voltage, transistors 117 switched on by the negative lead of the agc signal 122 are completely open, and flat gain is realized as the current flowing through the fixed-resistance path 118 is exclusively directed to the output. As the value of agc 122 rises, the differential pairs of transistors 116 switched on by the positive lead of the agc signal 122 begin to open and make available a high-bandwidth, high-frequency boost pathway 119 that introduces high-frequency gain into the transfer function of the circuit. This high-bandwidth boost pathway 119 may be implemented as a simple RC circuit using a combination of capacitors and resistors chosen with regard to the properties of the particular signal and transmission medium being handled. When this high-bandwidth pathway 119 reaches a maximum current, and still more gain is required, the fold signal 76 is activated using the mechanism described above as part of the gain control loop 71, and the activation of the fold signal 76 closes two switches 120 that make a low-bandwidth, high-frequency boost pathway 121—also implemented as a simple RC circuit using a combination of capacitors and resistors—available. As more low-bandwidth gain is required, the agc signal 122 falls in voltage back toward its baseline value, gradually closing the differential pairs of transistors 116 connected to the positive lead of the agc signal 122 and opening the differential pairs of transistors 117 connected to the negative lead of the agc signal 122, allowing current to shift from the high-bandwidth pathway 119 to the low-bandwidth pathway 121, and effectively frequency-shifting the transfer function to a lower bandwidth.

Implementing both gain boosting transfer functions of a folding adaptive equalizer stage by means of simple RC circuits within the same amplifier core, with a gain control signal that sweeps from its minimum to its maximum voltage and then back again once a folding signal has been activated, enables considerable savings in terms of circuit area, power consumption, and heat generation. It also improves the performance of the circuit due to reduced sources of noise and imperfections such as component noise, variation, and mismatch. Since a single circuit can be used for either a high-bandwidth gain boost or a low-bandwidth gain boost, circuit area is reduced. Similarly, because the need for a separate low-bandwidth gain boost stage is eliminated, the power consumption and heat generation of the circuit is reduced. This is achieved by reusing and repurposing the existing active components that used to implement a unity gain signal path to what also produces a low-bandwidth gain boost transfer function, with only switching in passive components and adequately controlling this switching function within the adaptation loop of the adaptive equalizer. This stands in contrast to other implementations of a variable-bandwidth equalizer, such as that shown in FIG. 6, which achieve higher low-bandwidth gain boost by simply adding more stages of equalization and not reusing and repurposing the active components that are already biased and available.

A multi-stage equalizer core as depicted in FIG. 13 can be implemented using more than one of the gain stages detailed in FIG. 17. The onset of the gain applied by the high- and low-bandwidth circuit paths of the different stages can be set to cascade sequentially (as shown in FIG. 12) by using differential pairs of transistors with different activation thresholds in each of the different stages. As can be inferred by any skilled person in the art, the folding approach can be applied to an equalizer with any number of gain stages and is not limited to the example embodiments described here. A skilled person can also appreciate that instead of sequentially folding the cascaded stages as more low-bandwidth gain is required, all or some of the stages can be folded at the same time and be controlled by the same agc signal. Thus, all the possible combinations of parallel and sequential activation of folded or unfolded stages are possible and addressed by the current invention.

It will be appreciated by a person skilled in the art that the switch of the folding signal from a low level to a high level need not be implemented as a step function as depicted in FIG. 12, but could be more gradual. Using a hard switch in the folding signal level can help to ensure that the change in the folding signal coincides with a zero value for the negative-polarity gain control signal agcm, thereby preventing signal path discontinuities; but using a more gradual switch between folding signal levels may have practical advantages, and it exhibits an alternative mechanism for avoiding output signal path discontinuities (i.e., by not introducing the discontinuous folding signal input in the first place). Additionally, the graphs of FIG. 12 show an interval over which agc continues to increase but the values of agc1$p$, agc1$m$, agc2$p$ and agc2$m$ remain constant; the folding signal could, in an example embodiment of the invention, be gradually increased from its low level to its high level over this interval without affecting the output signal. It will further be appreciated that the second level of the folding signal need not be higher than the first, but could be lower instead.

The embodiments described herein are examples of structures, systems or methods having elements corresponding to the elements of the invention recited in the claims. This written description may enable those skilled in the art to make and use embodiments having alternative elements that likewise correspond to the elements of the invention recited in the claims. The intended scope of the invention thus includes other structures, systems or methods that do not differ from the literal language of the claims, and further includes other structures, systems or methods with insubstantial differences form the literal language of the claims.

The invention claimed is:

1. A gain stage, comprising:
   a high-bandwidth gain circuit that applies a high-bandwidth transfer function to a first input signal, the high-bandwidth transfer function having high-bandwidth gain modulated by the level of a second input signal; and
   a low-bandwidth gain circuit that applies a low-bandwidth transfer function to the first input signal, the low-bandwidth transfer function having zero gain if a third input signal is at a first level and having low-bandwidth gain inversely modulated by the level of the second input signal if the third input signal is at a second level.

2. The gain stage of claim 1, wherein the first input signal comprises a signal received by the gain stage after being transmitted through a non-ideal transmission medium and the second input signal comprises an automatic gain control signal.

3. The gain stage of claim 1, wherein the transfer functions applied by the high-bandwidth gain module and the low-bandwidth gain module have frequency-dependent gain.

4. The gain stage of claim 1, wherein the gain stage produces a continuous output signal in response to both continuous and discontinuous transitions between the first level and the second level of the third input signal.

5. The gain stage of claim 1, wherein the gain stage produces an output signal equal to the first input signal with the transfer functions of the high-bandwidth gain circuit and the low-bandwidth gain circuit applied to it.

6. The gain stage of claim 5, wherein the gain stage further comprises a flat gain pathway that is summed with the gain contributed by each of the gain circuits to produce the output signal of the gain stage.

7. The gain stage of claim 5, further comprising:
   a first flat gain pathway producing an output signal equal to the first input signal modulated by the second input signal;
   a second flat gain pathway producing an output signal equal to the first input signal inversely modulated by the second input signal; and
   the output signal of the gain stage is equal to the sum of the output signal of the first flat gain pathway, the output signal of the second flat gain pathway, the gain contributed by the high-bandwidth gain circuit, and the gain contributed by the low-bandwidth gain circuit.

8. The gain stage of claim 1, wherein the high-bandwidth gain circuit and the low-bandwidth gain circuit share some common circuit components.

* * * * *